United States Patent [19]

Kuhlman

[11] Patent Number: 5,777,479
[45] Date of Patent: Jul. 7, 1998

[54] LIGHTING TEST METHOD AND APPARATUS

[75] Inventor: Brian P. Kuhlman, Long Beach, Calif.

[73] Assignee: McDonnell Douglas Corporation, Huntington Beach, Calif.

[21] Appl. No.: 741,379

[22] Filed: Oct. 29, 1996

[51] Int. Cl.$^6$ .................................... G01N 27/60
[52] U.S. Cl. ............................... 324/452; 361/212
[58] Field of Search ............... 324/452, 32; 331/78; 336/58; 361/212

[56] References Cited

U.S. PATENT DOCUMENTS

| | | | |
|---|---|---|---|
| 3,585,552 | 6/1971 | Feather | 336/58 |
| 3,737,712 | 6/1973 | Hall | 313/325 |
| 3,866,114 | 2/1975 | Johnston | 324/32 |
| 4,233,835 | 11/1980 | Dahn | 324/452 |
| 4,892,626 | 1/1990 | Covey | 204/15 |
| 4,920,163 | 4/1990 | Guillaumon | 523/440 |
| 5,103,193 | 4/1992 | Von Bokern | 331/78 |

*Primary Examiner*—Vinh P. Nguyen
*Assistant Examiner*—Thomas Valone
*Attorney, Agent, or Firm*—Harness Dickey & Pierce P.L.C.

[57] ABSTRACT

An apparatus and method for simulating a lightning strike on a test specimen without causing contaminants to be deposited on the test specimen. The apparatus includes an electrode and an ionizing element electrically coupled thereto. The ionizing element has a substrate coated with an ionizing material and extends between the electrode and an outer surface of a test specimen so as to define an air gap therebetween. The ionizing element is coupled at a first end to the electrode and has a distal or free end which extends toward the test specimen for carrying an electrical test charge thereto. The test charge is developed by a generator electrically coupled to the electrode. The ionizing element is utilized to develop a long arc channel between the electrode and the outer surface of the test specimen. The ionizing element serves to transmit the electrical test charge to the test specimen without depositing contaminants on the test specimen while closely simulating a natural lightning strike.

18 Claims, 1 Drawing Sheet

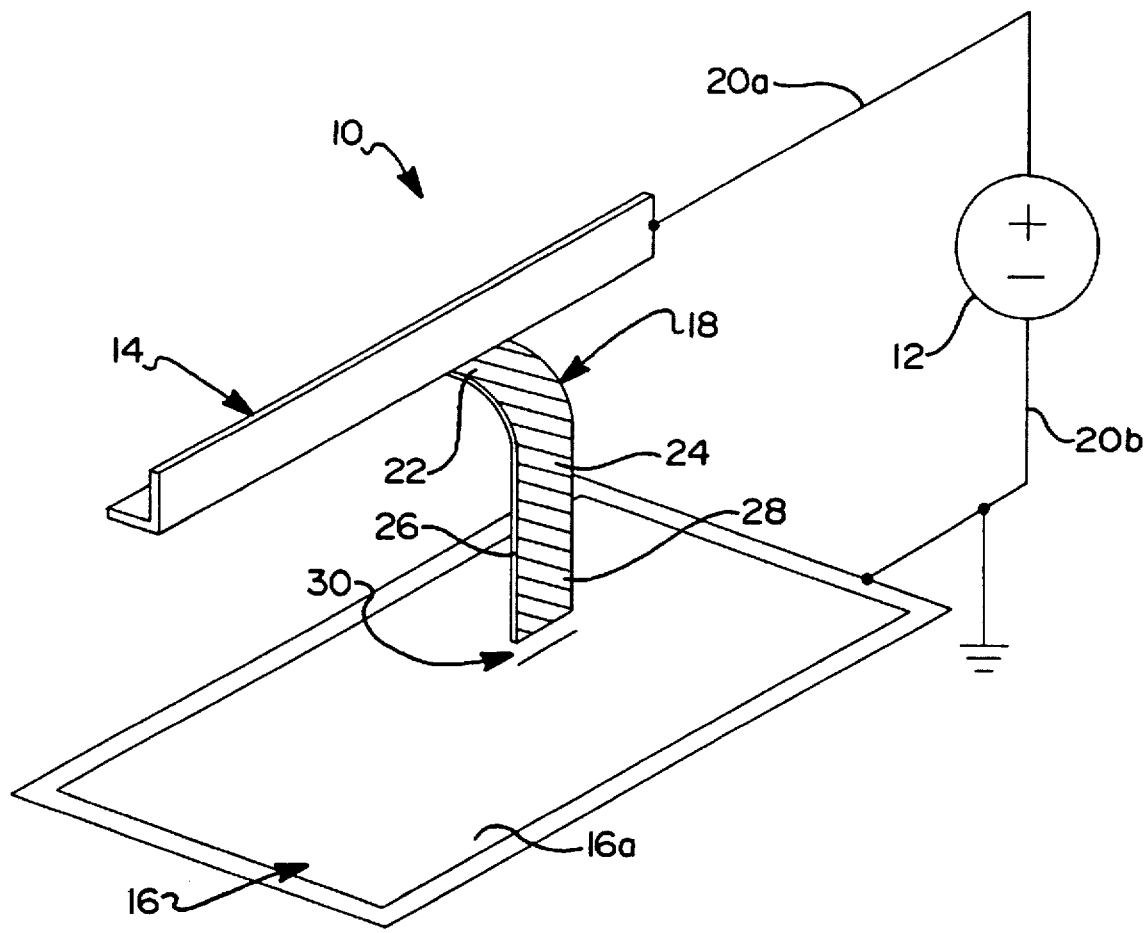

LIGHTING TEST METHOD AND APPARATUS

BACKGROUND OF THE INVENTION

1. Technical Field

The present invention generally relates to techniques for simulating a lightning strike and more particularly to an apparatus and a method of simulating a lightning strike employing an ionizing film disposed on a paper substrate to develop a long arc channel.

2. Discussion

As is generally known in the art of lightning testing, lightning simulations conducted in a laboratory cannot reproduce the full voltage range available in nature. Therefore, many lightning tests require generating a long arc channel to simulate the hazardous conditions of nature on a test specimen. One prior art method utilized to develop a long arc channel requires inserting a fine wire over the air gap between a high-voltage electrode and a test article.

According to the wire method, a high-voltage generator is discharged across an air gap to the test article. The wire is vaporized by the test charge and an ionized channel is created for the current to flow. However, this method also introduces impurities into the test site and results in a large blackened area and a metal film being deposited on the test surface. Furthermore, the damage to the test article is enhanced by the metal vapor being accelerated into the specimen. Moreover, the high-voltage is only presented at a single point along the test surface which may or may not be located over a weak spot in the dielectric test specimen. This type of presentation causes more favorable test results than natural lightning strikes. Also, the distance between the electrode and the test surface is so small that only a fraction of a lightning bolt may be simulated which prevents naturally occurring events from being duplicated. The exploding wire also causes an oscillation in the front of the current wave form that deviates from the Federal Aviation Administration (FAA) standardized test wave forms.

Accordingly, it is desirable to provide a method for simulating a lightning strike which develops a long arc channel while minimizing the level of impurities being introduced into the test site and eliminating large blackened areas and metal films from being deposited on the test surface. It is also desirable to reduce the potential for metal vapor being accelerated into the specimen and to present the high-voltage across the test surface in a manner which more closely mimics natural lightning strikes. It is further desirable to provide a lightning strike test method which results in minimal oscillation in the rising edge of the current wave form.

SUMMARY OF THE INVENTION

The above and other objects are provided by an apparatus comprising a source of an electrical discharge and an ionixing element having a substrate coated with an ionizing material extending between an electrode and a test specimen. According to the invention, the electrode and test specimen are electrically coupled to the electrical discharge source. The test specimen is positioned opposite the electrode for receiving the electrical discharge from the electrode. The substrate with ionizing material disposed thereon is coupled at a first end to the electrode and is extended toward the panel for carrying the electrical discharge thereto.

BRIEF DESCRIPTION OF THE DRAWINGS

In order to appreciate the manner in which the advantages and objects of the invention are obtained, a more particular description of the invention will be rendered by reference to specific embodiments thereof which are illustrated in the appended drawings. Understanding that these drawings only depict preferred embodiments of the present invention and are not therefore to be considered limiting in scope, the invention will be described and explained with additional specificity and detail through the use of the accompanying drawings in which:

FIG. 1 is a perspective view of a test apparatus for simulating a lightning strike.

DETAILED DESCRIPTION OF THE PREFERRED EMBODIMENTS

Referring to FIG. 1, an apparatus for simulating a lightning strike is shown generally at 10. The present invention employs an ionizing element comprising an ionizing film disposed on a paper substrate. The ionizing element is utilized to develop a long arc channel between an electrode and a test specimen for current flow. The present invention utilizes a combination of materials that achieve low breakdown voltage and uses a low-mass substrate to facilitate an electrical breakdown while transporting contaminants away from the test specimen. The method also includes a large fixed test gap and a wide ionizing element which exposes a large area of the test specimen to the test voltage.

The size and positioning of the ionizing substrate can be varied to expose a large area of the test specimen surface to high voltage. The substrate can also be formed with a point at a distal end to target a certain area on the test specimen. In either case, few contaminants are introduced into the test specimen and the ionized channel closely mimics a natural lightning strike condition. Furthermore, no blackened area is produced from vaporized wires and no metallic film is left on the test specimen. Accordingly, actual damage caused by the applied current can be readily observed on the test surface.

Still referring to FIG. 1, the apparatus 10 comprises a low-voltage high-current generator 12, an electrode 14, and a test specimen 16. Low voltage in this case is a relative term meaning approximately $1/10$ to $1/20$ of the voltage needed to form an electrical breakdown between the electrode and test specimen without any wire or ionizing film (the voltage is actually fairly high, at tens of thousands of volts). The electrode 14 is electrically coupled to the low-voltage high-current generator 12 such that a current can be applied thereto. The low-voltage high-current generator 12 is also electrically coupled to a test specimen 16 which is positioned opposite the electrode 14. The apparatus 10 also includes an ionizing element 18, which is described in greater detail below, suspended between the electrode 14 and the test specimen 16. As can be seen in FIG. 1, the test specimen 16 is positioned so that a test charge delivered to the electrode 14 from the generator 12 is carried by the ionizing element 18 and is received on the test surface 16. Conventional test panels 16 such as painted carbon composite structures including carbon fibers in the form of cloth or laid in parallel strands with epoxy to create a mat, as well as fiberglass antennae, lights, and metal components can be utilized effectively for this purpose.

A wire harness 20a or other conventional conducting means is utilized to electrically connect the electrode 14 to the low-voltage high-current generator 12. Also, a conventional wire harness 20b electrically couples the generator 12 to the test specimen 16. The low-voltage high-current generator 12 is preferably capable of generating a discharge of at least 100,000 amps at 50,000 volts. Also, the electrode 14 is preferably an aluminum angle stock suspended above the test specimen 16.

As can be seen, the ionizing element 18 is secured at a proximal end 22 to the electrode 14 and preferably comprises an ionizing material 24 in the form of a metallic or ionizing paint 24 deposited on a paper substrate 26. Even more preferably, the ionizing material 24 is non-conductive silver-colored spray paint and the substrate 26 is newsprint. The distal end 28 of the ionizing element 18 is suspended above the test specimen 16 such that it extends adjacent to but spaced from an outer surface 16a of the test specimen 16. Thus, an air gap 30 is defined between the distal end 28 of the ionizing element 24 and the outer surface of 16a the test specimen 16. Preferably, the air gap is equal to ½ of an inch. However, gaps between 1/16 inch to 1 inch have been utilized with success.

It should also be noted that the ionizing material 24, and particularly the paper substrate 26, is generally in the shape of a thin rectangle, preferably one inch wide by six inches long. Therefore, the paper distal end 28 of the substrate 26 can be made wider than conventional wire elements. Accordingly, a larger area of the test specimen 16 may be exposed to the test voltage. Also, the use of a paper substrate 26 and an ionizing paint material 24 increases the distance between the electrode 14 and the test specimen 16 which may be bridged by the test charge. Furthermore, at conventional distances between the electrode 14 and the test specimen 16, the use of the paper substrate 26 and ionizing material 24 enables a low-voltage discharge to be utilized as a test charge while still facilitating electrical breakdown of the ionizing element 18 and additionally transporting contaminants away from the test site.

In operation, the ionizing element 18 is cut into strips of predetermined dimensions for a 100,000 amp discharge. The proximal end 22 of the ionizing element 18 is secured to the electrode 14 and the electrode 14 is electrically coupled to the low-voltage generator 12. Preferably, the distal end 28 of the ionizing element 18 is extended to within ½ of an inch from the surface of the test specimen 16 and the electrode 14 is raised to 50,000 volts by discharging the high-current generator 12.

The discharge of the generator 12 delivers a test charge to the electrode 14 which causes the paper substrate 26 to ionize. The paper substrate 26 carries the test charge to the distal end 28 of the substrate 26 where it jumps to the surface of the test specimen 16. The paper substrate 26 is laterally expelled from the test area by the expanding arc channel formed on paper surface of the substrate 26. As a result, the test other surface 16a the specimen 16 shows the effects of the arc channel without having a blackened area from vaporizing wires formed thereon. It should be noted that the current invention enables lower voltages to be used to bridge distances between the electrode and test specimen equivalent to the prior art. Also, the distance between the electrode and test specimen may be substantially increased over the prior art by using voltage levels equivalent to the prior art. Also, the tests results may be varied by only coating one or the other surface of the substrate 26 with the ionizing material 24.

The present invention has great potential for use as a lightning protection device. This is accomplished by applying the same combination of materials to dielectric surfaces. For instance, a sheet of newsprint colored with a silver paint could be placed over an object. This would cause a lightning strike to flash over the surface of the object rather than breaking down the dielectric material. Dielectric material breakdown frequently results in a hole being formed in the material which leads to further damage to the structure or underlying equipment.

The present invention also has potential uses for simulating a lightning swept stroke on an aircraft. This occurs in nature when an aircraft's forward movement stretches an ongoing lightning strike across the aircraft's surface from a forward attachment point. This is simulated by positioning a section of a paper substrate with ionizing material disposed thereon parallel to the surface of a test panel and angling the distal end of the substrate perpendicular to the test surface. This duplicates the path of the lightning strike and creates a lightning channel similar to the swept stroke without the need for high speed air flow.

It can now be appreciated that the present invention provides an improved lightning strike test method which generates a long arc channel without using a wire conductor. The method prevents impurities from being introduced into the test site and eliminates large blackened areas and metal films from being deposited on the test surface. Furthermore, damage to the test specimen is not enhanced by metal vapor being accelerated onto the test surface. Moreover, the test current wave form is smooth at the onset of the current without oscillations. The present invention has been found to increase the distance between an electrode and a test panel that can be bridged by a test charge by more than a factor of five (5).

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and following claims.

What is claimed is:

1. An apparatus for simulating a lightning strike, said apparatus comprising:
   an electrode adapted to be electrically coupled to a source of electrical energy for transmitting said electrical energy;
   a test specimen for receiving said electrical energy from said electrode;
   a substrate electrically responsive to said electrode; and
   an ionizing material disposed on said substrate for carrying said electrical energy to said test specimen, said substrate and said ionizing material facilitating electrical breakdown and transporting of contaminants away from said test specimen when subjected to said electrical energy while applying said electrical energy to said test specimen.

2. The apparatus of claim 1 wherein said substrate comprises paper.

3. The apparatus of claim 1 wherein said substrate comprises newsprint.

4. The apparatus of claim 1 wherein said ionizing material comprises paint.

5. The apparatus of claim 1 wherein said ionizing material comprises a non-conductive, colored paint.

6. The apparatus of claim 1 wherein said substrate includes a proximal end secured to said electrode and a distal end projecting toward said test specimen so as to define an air gap between said distal end and said test specimen.

7. The apparatus of claim 6 wherein said air gap is approximately equal to ½ inch.

8. The apparatus of claim 1 wherein said electrode comprises an aluminum support.

9. The apparatus of claim 1 wherein said electrode is positioned opposite said test specimen.

10. The apparatus of claim 1 wherein said test specimen comprises a painted carbon composite structure.

11. The apparatus of claim 1 further comprising a low-voltage, high-current generator for supplying said electrical energy.

12. The apparatus of claim 11 wherein said generator is capable of generating an electrical signal having a current of at least about 100,000 amps and a voltage of at least about 50,000 volts.

13. An apparatus for creating a long arc channel to simulate a lightning strike, said apparatus comprising:

an electrode adapted to be electrically coupled to an electrical generator;

a test specimen responsive to said generator and positioned such that a test charge from said electrode is received thereon;

a paper substrate having a proximal end coupled to said electrode and a distal end projecting towards said test specimen so as to define an air gap between said distal end and said test specimen; and an ionizing paint disposed on said paper substrate for carrying said test charge to said test specimen, wherein said test charge causes said paper substrate to be repelled away from said test specimen when said test charge is applied to said paper substrate.

14. The apparatus of claim 13, further comprising a low-voltage high-current generator capable of generating at least 100,000 amps at 50,000 volts.

15. The apparatus of claim 14 wherein said electrode comprises an aluminum angle stock.

16. The apparatus of claim 14 wherein said test specimen comprises a painted carbon composite structure.

17. The apparatus of claim 13 wherein said air gap is approximately equal to ½ inch.

18. A method of simulating a lightning strike, comprising the steps of:

generating a high current test charge using an electrode responsive to said test charge to transmit said test charge;

using an ionizing element having a paper substrate and an ionizing paint deposited thereon, said paper substrate being electrically coupled to said electrode, for receiving said test charge and transmitting said test charge to a test specimen; and using a test specimen spaced apart from a distal end of said ionizing element to receive said test charge, wherein said test charge causes said distal end of said ionizing element to be repelled away from said test specimen as said test charge is applied to said test specimen while simulating a lightning strike on said test specimen.

* * * * *

UNITED STATES PATENT AND TRADEMARK OFFICE
CERTIFICATE OF CORRECTION

PATENT NO. : 5,777,479
DATED : July 7, 1998
INVENTOR(S) : Brian P. Kuhlman

It is certified that error appears in the above-identified patent and that said Letters Patent is hereby corrected as shown below:

Column 1, Line 54-55, "ion-ixing" should be --ion-izing--.

Column 3, Line 50, delete "test other" and insert -- outer --.

Column 3, Line 50, insert -- of -- after 16a.

Signed and Sealed this

Tenth Day of November 1998

Attest:

BRUCE LEHMAN

*Attesting Officer*  *Commissioner of Patents and Trademarks*